United States Patent
Naraoka

(10) Patent No.: US 9,774,003 B2
(45) Date of Patent: Sep. 26, 2017

(54) ORGANIC ELECTROLUMINESCENT ELEMENT AND ELECTRONIC INSTRUMENT

(71) Applicant: Idemitsu Kosan Co., Ltd., Tokyo (JP)

(72) Inventor: Ryo Naraoka, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 248 days.

(21) Appl. No.: 14/425,232

(22) PCT Filed: Aug. 26, 2013

(86) PCT No.: PCT/JP2013/072690
§ 371 (c)(1),
(2) Date: Mar. 2, 2015

(87) PCT Pub. No.: WO2014/034595
PCT Pub. Date: Mar. 6, 2014

(65) Prior Publication Data
US 2015/0236300 A1 Aug. 20, 2015

(30) Foreign Application Priority Data
Sep. 3, 2012 (JP) ................................. 2012-193501

(51) Int. Cl.
*H01L 51/52* (2006.01)
*H01L 51/50* (2006.01)
*H01L 51/00* (2006.01)

(52) U.S. Cl.
CPC ...... *H01L 51/5262* (2013.01); *H01L 51/0096* (2013.01); *H01L 51/5012* (2013.01);
(Continued)

(58) Field of Classification Search
CPC ............. H01L 51/5262; H01L 51/5209; H01L 51/5225; H01L 51/5012
See application file for complete search history.

(56) References Cited

U.S. PATENT DOCUMENTS

| | | | |
|---|---|---|---|
| 2006/0176421 A1* | 8/2006 | Utsumi | G02F 1/133611 349/69 |
| 2007/0085476 A1* | 4/2007 | Hirakata | H01L 51/5281 313/506 |
| 2013/0186467 A1* | 7/2013 | Saeki | B29C 33/424 136/259 |

FOREIGN PATENT DOCUMENTS

| | | |
|---|---|---|
| JP | H08-321381 A | 12/1996 |
| JP | 2003-051389 A | 2/2003 |

(Continued)

OTHER PUBLICATIONS

Okamoto et al., "Plasmonics—Foundaton and application" Kodansha, Oct. 1, 2010, p. 39.
(Continued)

*Primary Examiner* — Michael Jung
*Assistant Examiner* — Mikka Liu
(74) *Attorney, Agent, or Firm* — Foley & Lardner LLP

(57) ABSTRACT

The first electrode has a convexo-concave structure including a plurality of convex portions and a plurality of concave portions at an interface with the organic compound layer. The convexo-concave structure has at least one cross section in a thickness direction of the light-transmissive substrate, the cross section being shaped in a sine-wave curve or a curve represented by a sum of a plurality of sine waves having different amplitudes or angles. A distance between a convex portion and an adjacent convex portion forming the convexo-concave structure is equal to or more than a peak wavelength of light radiated from the emitting layer and is equal to or less than a propagation distance ($L_{sp}$) of surface plasmon at the interface between the first electrode having the convexo-concave structure and the organic compound layer.

20 Claims, 9 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5096* (2013.01); *H01L 51/5209* (2013.01); *H01L 51/5225* (2013.01); *H01L 51/5231* (2013.01); *H01L 51/5265* (2013.01); *H01L 51/5268* (2013.01); *H01L 51/5275* (2013.01); *H01L 2251/301* (2013.01); *H01L 2251/308* (2013.01)

(56) References Cited

FOREIGN PATENT DOCUMENTS

| | | |
|---|---|---|
| JP | 2004-031350 A | 1/2004 |
| JP | 2004-125916 A | 4/2004 |
| JP | 2004-126074 A | 4/2004 |
| JP | 2004-319100 A | 11/2004 |
| JP | 2005-535121 A | 11/2005 |
| JP | 2006-269163 A | 10/2006 |
| JP | 2007-005277 A | 1/2007 |
| JP | 2007-073405 A | 3/2007 |
| JP | 2009-044117 A | 2/2009 |
| JP | 2009-094219 A | 4/2009 |
| JP | 2009-140894 A | 6/2009 |
| JP | 2009-140913 A | 6/2009 |
| JP | 2009-140915 A | 6/2009 |
| JP | 2009-266429 A | 11/2009 |
| JP | 2009-272194 A | 11/2009 |
| JP | 2010-272465 A | 12/2010 |
| JP | 2010-287562 A | 12/2010 |
| JP | 2011-014361 A | 1/2011 |
| JP | 2012-028307 A | 2/2012 |
| WO | WO-2012/043828 A1 | 4/2012 |

OTHER PUBLICATIONS

International Preliminary Report on Patentability issued in PCT/JP2013/072690 dated Mar. 3, 2015.

* cited by examiner

ORGANIC ELECTROLUMINESCENT ELEMENT AND ELECTRONIC INSTRUMENT

CROSS REFERENCE TO RELATED APPLICATIONS

This application is the National Phase of PCT/JP2013/072690, filed Aug. 26, 2013, which claims priority to Japanese Application No. 2012-193501, filed Sep. 3, 2012.

TECHNICAL FIELD

The present invention relates to an organic electroluminescence device and electronic equipment provided with the organic electroluminescence device.

BACKGROUND ART

There has been known an organic electroluminescence device (hereinafter, occasionally referred to as an "organic EL device") that includes an organic compound layer (in which an emitting layer is included) between an anode and a cathode and emits light using exciton energy generated in the organic compound layer by a recombination of holes injected into the emitting layer from the anode and electrons injected into the emitting layer from the cathode.

Such an organic EL device, which has the advantages as a self-emitting device, is expected to serve as an emitting device excellent in luminous efficiency, image quality, power consumption and thin design.

In an optical design of the organic EL device, adjustment of an optical interference distance and the like are conducted in order to improve a luminous efficiency. By adjusting a film thickness of the organic compound layer (e.g., hole transporting layer), an effective luminous efficiency can be improved and emission spectrum can be modulated. Thus, the adjustment of the optical interference distance is a requisite means for the device design.

However, the adjustment of the optical interference distance is not sufficient for extracting light trapped within the device. Accordingly, an arrangement of the device for efficiently extracting the light trapped within the device to improve the luminous efficiency has been studied.

In a device arrangement in which light is extracted toward a light-transmissive support substrate (light-transmissive body) supporting the organic compound layer, the light is mainly lost in the following modes.

(i) Substrate Mode

A substrate mode is a mode of the light trapped within the light-transmissive body due to total reflection of the light at an interface between the light-transmissive body and air.

(ii) Thin Film Mode

A thin film mode is a mode of the light trapped in a transparent electrode and the light-transmissive body due to total reflection of the light at an interface between the transparent electrode and the light-transmissive body.

(iii) Surface Plasmon Mode

A surface plasmon mode is a mode of the light of which luminous energy is absorbed in a metal electrode as surface plasmon. The term "surface plasmon" refers to waves that are localized at an interface between metal and a dielectric in a form of a combination of charge compression waves propagated along the interface and electromagnetic waves accompanying the charge compression waves. "Plasmon" is an abbreviation for "Plasmon Polariton" representing a phenomenon that some force is applied on free electrons evenly present in metal to generate and propagate polarization waves. In such a phenomenon, a particular instance where the polarization waves are propagated along an interface between metal and a dielectric is referred to as the surface plasmon or surface plasmon polariton.

Light loss in the above modes accounts for from several tens to almost 100 percent of a total luminous energy in an organic emitting layer depending on existing conditions of luminous molecules. Accordingly, extraction of the light in such loss modes is a requisite for development of an organic electroluminescence device exhibiting a highly efficient emission Light is trapped in the substrate mode, thin film mode and surface plasmon mode because the light radiated from the emitting layer is trapped within the organic electroluminescence device as evanescent light. It is considered to be the most difficult to extract the light in the surface plasmon mode as compared with the other optical modes. Some specific methods of extracting the light in the surface plasmon mode have been reported.

For example, Patent Literature 1 discloses that the light in the surface plasmon mode can be a useful radiation in a form of Bragg scattering with use of Bragg diffraction.

CITATION LIST

Patent Literature(S)

Patent Literature 1: JP-A-2005-535121

SUMMARY OF THE INVENTION

Problems to be Solved by the Invention

However, the organic EL device having a convexo-concave structure causing Bragg diffraction exhibits strong wavelength dependency and angle dependency to radiate a highly directional light. Moreover, the light loss is sometimes an obstacle for providing a highly efficient organic electroluminescence device (i.e., improving an external quantum efficiency) as described above.

An object of the invention is to provide an organic electroluminescence device capable of lowering directionality of radiation light and improving an external quantum efficiency. Moreover, another object of the invention is to provide electronic equipment provided with the above organic electroluminescence device of the invention.

Means for Solving the Problems

An organic electroluminescence device according to an aspect of the invention includes: a first electrode; a second electrode facing the first electrode; an organic compound layer provided between the first electrode and the second electrode, the organic compound at least including an emitting layer; a light-transmissive substrate provided to an opposite surface of the second electrode from a surface of the second electrode facing the first electrode, in which the first electrode or the second electrode has a convexo-concave structure including a plurality of convex portions and a plurality of concave portions at an interface with the organic compound layer, the convexo-concave structure has at least one cross section in a thickness direction of the light-transmissive substrate, the cross section being shaped in a sine-wave curve or a curve of a sum of a plurality of sine waves having different amplitudes or angles, and a distance between adjacent ones of the plurality of convex portions forming the convexo-concave structure is equal to or more than a peak wavelength of light radiated from the emitting layer and is equal to or less than a propagation distance (Lsp) of surface plasmon represented by a numerical formula (1) below at the interface between one of the first electrode and the second electrode having the convexo-concave structure and the organic compound layer.

Numerical Formula 1

$$L_{sp} = 1/Im(2k_{sp}) \quad (1)$$

In the numerical formula (1), Im represents an imaginary part of a complex number, and $k_{sp}$ represents a wave number of the surface plasmon and is represented by a numerical formula (2) below. In the numerical formula (2), ω represents a frequency of light, c represents a speed of the light, $\in_1$ represents a complex permittivity of the organic compound layer, and $\in_2$ represents a complex permittivity of one of the first electrode and the second electrode having the convexo-concave structure.

Numerical Formula 2

$$k_{sp} = \frac{\omega}{c} \times \sqrt{\frac{(\varepsilon_1 \times \varepsilon_2)}{(\varepsilon_1 + \varepsilon_2)}} \quad (2)$$

An organic electroluminescence device according to another aspect of the invention includes: a first electrode; a second electrode facing the first electrode; an organic compound layer provided between the first electrode and the second electrode, the organic compound at least including an emitting layer; a light-transmissive substrate provided to an opposite surface of the second electrode from a surface of the second electrode facing the first electrode; and an inner-light extraction layer that is provided adjacent to a surface of the light-transmissive facing the second electrode, in which the inner-light extraction layer includes: a first convexo-concave structure comprising a plurality of first convex portions and a plurality of first concave portions, the first convexo-concave structure being provided on an opposite surface of the inner-light extraction layer from a surface of the inner-light extraction layer facing the light-transmissive substrate, the first electrode also includes a second convexo-concave structure that is formed matching the first convexo-concave structure and includes a plurality of second convex portions and a plurality of second concave portions, the second convexo-concave structure includes at least one cross section in a thickness direction of the light-transmissive substrate, the cross section being shaped in a sine-wave curve or a curve of a sum of a plurality of sine waves having different amplitudes or angles, a distance between adjacent ones of the plurality of second convex portions forming the second convexo-concave structure is equal to or more than a peak wavelength of light radiated from the emitting layer and is equal to or less than a propagation distance ($L_{sp}$) of surface plasmon represented by a numerical formula (3) below at an interface between the first electrode and the organic compound layer.

Numerical Formula 3

$$L_{sp} = 1/I(2k_{sp}) \quad (3)$$

In the numerical formula (3), Im represents an imaginary part of a complex number, and $k_{sp}$ represents a wave number of the surface plasmon and is represented by a numerical formula (4) below.

In the numerical formula (4), ω represents a frequency of light, c represents a speed of the light, $\in_1$ represents a complex permittivity of the organic compound layer, and $\in_2$ represents a complex permittivity of the first electrode.

Numerical Formula 4

$$k_{sp} = \frac{\omega}{c} \times \sqrt{\frac{(\varepsilon_1 \times \varepsilon_2)}{(\varepsilon_1 + \varepsilon_2)}} \quad (4)$$

DESCRIPTION OF EMBODIMENT(S)

First Exemplary Embodiment

A first exemplary embodiment of the invention will be described below with reference to the attached drawings.

Organic Electroluminescence Device

Figure 1:
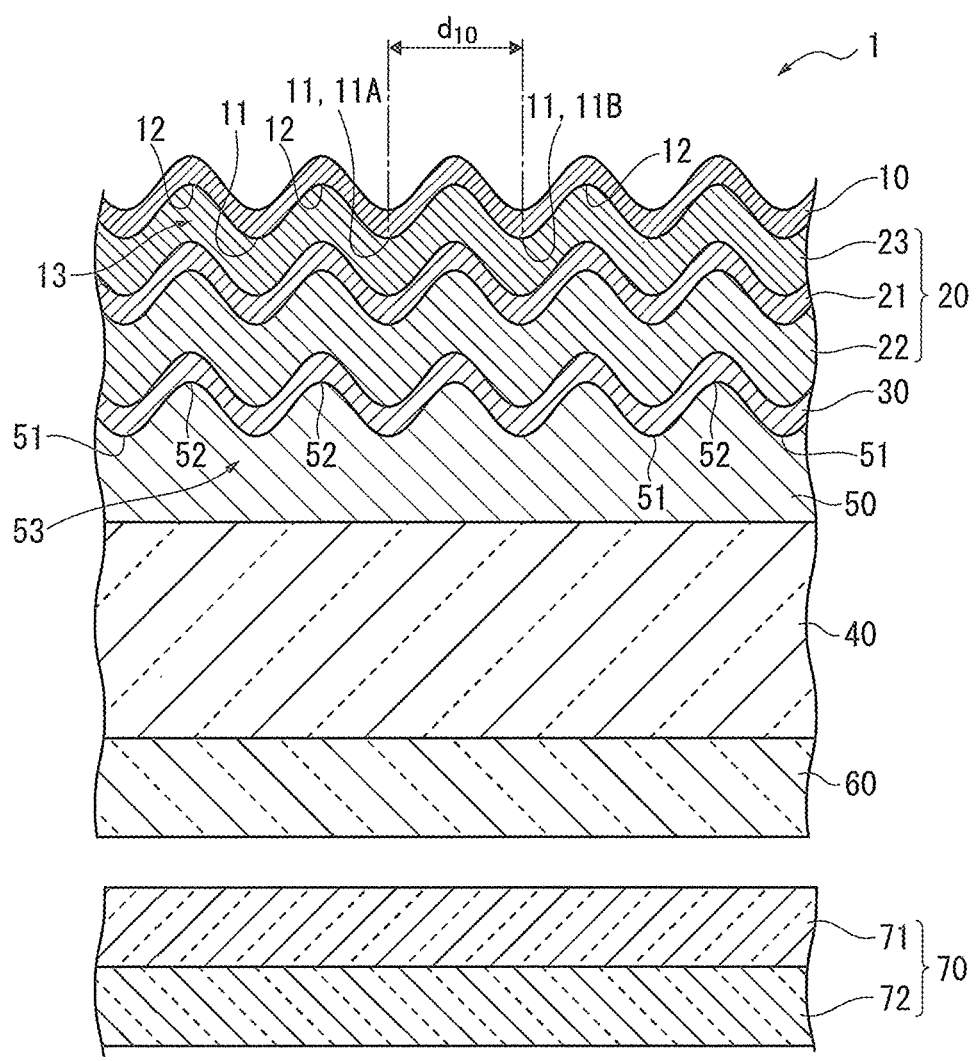
FIG. 1 is a schematic cross-sectional view in a substrate thickness direction of an organic EL device according to a first exemplary embodiment.

FIG. 1 is a schematic cross-sectional view in a substrate thickness direction of an organic EL device 1 according to the first exemplary embodiment.

The organic EL device 1 includes a first electrode 10, organic compound layer 20, second electrode 30, light-transmissive substrate 40, inner-light extraction layer 50, and outer-light extraction layer 60 which are laminated in this order from the first electrode 10. In the first exemplary embodiment, as shown in FIG. 1, an optical member 70 is provided on an opposite side of the light-transmissive substrate 40 from a side where the inner-light extraction layer 50 is provided. The outer-light extraction layer 60 is interposed between the optical member 70 and the light-transmissive substrate 40.

Light-Transmissive Substrate

The light-transmissive substrate 40 is a flat plate member for supporting the first electrode 10, organic compound layer 20, second electrode 30, inner-light extraction layer 50, and outer-light extraction layer 60. The organic EL device 1 is a so-called bottom-emission organic EL device in which light radiated from the organic compound layer 20 is extracted through the light-transmissive substrate 40. Accordingly, the light-transmissive substrate 40, which is made of a light-transmissive member, preferably transmits 50% or more of light in a visible region of 400 nm to 700 nm. Specific examples of the substrate are a glass plate and a polymer plate. To be more specific, the glass plate includes soda-lime glass, barium/strontium-containing glass, lead glass, aluminosilicate glass, borosilicate glass, barium borosilicate glass, quartz, and the like. For the polymer plate, materials such as polycarbonate resins, acryl resins, polyethylene terephthalate resins, polyether sulfide resins and polysulfone resins can be used. A refractive index $n_2$ of the light-transmissive substrate 40 is preferably in a range of 1.4 to 2.2. The upper limit of the refractive index $n_2$ of the light-transmissive substrate 40 is defined as 2.2 because a refractive index of a transparent electrode material is about 2.2 or less. When the refractive index $n_2$ of the light-transmissive substrate exceeds 2.2, an amount of the light trapped due to total reflection occurring on the substrate surface is unfavorably significantly increased. When the refractive index $n_2$ of the light-transmissive substrate exceeds 2.2, it is required to use the outer-light extraction layer 60 having an appropriate structure.

First Electrode

The first electrode 10 is provided adjacent to the organic compound layer 20 and is made of an electrode material usable for organic EL devices.

The first electrode 10 is preferably made of a light reflective material, preferably a metal such as Al, Cu, Ag, Au and an alloy thereof. However, the first electrode 10 may not be formed of a metal.

The first electrode 10 may be provided by a single layer or a plurality of layers. The first electrode 10 may be provided by a laminate of layers formed of the light reflective material. Alternatively, the first electrode 10 may be provided by a laminate of a layer formed of a transparent conductive member and a layer formed of the light reflective material.

Second Electrode

The second electrode 30 is provided adjacent to and between the organic compound layer 20 and the inner-light extraction layer 50 and is also provided to an opposite side of the organic compound layer 20 from the first electrode 10. In the first exemplary embodiment, since the light radiated from the organic compound layer 20 is extracted to the outside of the device through the light-transmissive substrate 40 as described above, the second electrode 30 is a transparent electrode. In this arrangement, the second electrode 30 preferably transmits more than 10% of the light in the visible region. Sheet resistance of the second electrode 30 is preferably 100Ω/square or lower. Although depending on the material for the second electrode 30, a thickness of the second electrode 30 is typically selected in a range of 10 nm to 1 μm, and is preferably selected in a range of 10 nm to 200 nm.

In the first exemplary embodiment, the second electrode 30 is the anode while the first electrode 10 is the cathode. However, the second electrode 30 may be the cathode while the first electrode 10 may be the anode.

The second electrode 30 is made of a known electrode material, for instance a transparent electrode material such as ITO (indium tin oxide), IZO (registered trademark) (indium zinc oxide), and ZnO (zinc oxide). A refractive index $n_1$ of the second electrode 30 is preferably in a range of 1.8 to 2.2. In an arrangement that radiation light is extracted to the outside of the device through the first electrode 10, the first electrode 10 is a transparent electrode and the second electrode 30 is made of a light reflective material, preferably a metal such as Al, Cu, Ag, Au and an alloy thereof. However, also in this arrangement, the second electrode 30 may not be formed of a metal.

Organic Compound Layer

The organic compound layer 20 is interposed between the first electrode 10 and the second electrode 30. The organic compound layer 20 is provided by a single layer or a plurality of layers. At least one layer of the organic compound layer 20 is an emitting layer. Accordingly, the organic compound layer 20 may be provided by a single emitting layer. Alternatively, the organic compound layer 20 may be provided by layers applied in a known organic EL device such as a hole injecting layer, a hole transporting layer, an electron injecting layer, an electron transporting layer, a hole blocking layer, an electron blocking layer. The organic compound layer 20 may include an inorganic compound.

In the first exemplary embodiment, the organic compound layer 20 includes a first organic layer 22, emitting layer 21 and second organic layer 23 which are provided in this order from the second electrode 30.

The emitting layer 21 of the organic compound layer 20, which is formed of known emitting materials such as $Alq_3$ (tris(8-hydroxyquinolinato)aluminum), is configured to provide a single-color emission such as red, green, blue or yellow emission or configured to provide a combined-color emission (e.g., white-color emission) of red, green, blue and yellow emission. In forming the emitting layer, a doping method, according to which an emitting material (dopant material) is doped to a host material, has been known as a usable method. The emitting layer formed by the doping method can efficiently generate excitons from electric charges injected into the host material. With the exciton energy generated by the excitons being transferred to the dopant material, the dopant material can emit light with high efficiency. In the exemplary embodiment of the invention, the emitting layer may be a fluorescent emitting layer using emission caused by singlet excitons or a phosphorescent emitting layer using emission caused by triplet excitons.

The emitting layer 21 may be provided by a single emitting layer, or may be provided by a laminate of a plurality of emitting layers. When the emitting layer 21 is provided by the laminate, the emitting layer 21 may be a laminate in a tandem arrangement in which an intermediate layer is laminated between the emitting layers. In the laminate of the plurality of emitting layers, each of the emitting layers may be a fluorescent emitting layer or a phosphorescent emitting layer. An emission color can also be selected as needed. For instance, extraction of radiation light in a form of white light out of the organic EL device is achievable by laminating the red, green and blue emitting layers.

In the first exemplary embodiment, a proper material for the first organic layer 22 is selected so that the first organic layer 22 serves as a layer (e.g., at least one of a hole injecting layer and a hole transporting layer) for efficiently transporting and injecting holes injected from the second electrode 30 (anode) to the emitting layer 21. On the other hand, a proper material for the second organic layer 23 is selected so that the second organic layer 23 serves as a layer (e.g., at least one of an electron injecting layer and an electron transporting layer) for efficiently transporting and injecting electrons injected from the first electrode 10 (cathode) to the emitting layer 21.

In the organic compound layer 20 of the organic EL device 1, in addition to the above exemplary compound, any compound selected from compounds to be used in the organic El device is usable.

Inner-Light Extraction Layer

The inner-light extraction layer 50 converts distribution of radiation light from the emitting layer 21 of the organic compound layer 20 before the radiation light enters the light-transmissive substrate 40.

The inner-light extraction layer 50 is provided adjacent to a surface of the light-transmissive substrate 40 facing the second electrode 30. The inner-light extraction layer 50 includes a first convexo-concave structure 53 having a plurality of first convex portions 51 and a plurality of second concave portions 52, the first convexo-concave structure 53 being provided on an opposite surface of the inner-light extraction layer 50 from a surface thereof facing the light-transmissive substrate 40.

At least one cross section of the first convexo-concave structure 53 in a thickness direction of the light-transmissive substrate 40 is shaped in a sine-wave curve or a curve represented by a sum of a plurality of sine waves having different amplitudes or angles. The first convexo-concave structure 53 preferably has a cross section shaped in a sine-wave curve. When the inner-light extraction layer 50 is shaped in a square wave or a triangular wave, disconnection or leakage is unfavorably likely to occur.

Not only one cross section but also a plurality of cross sections of the first convexo-concave structure 53 in the thickness direction of the light-transmissive substrate 40 may be formed in the above-described curve. Moreover, in a plan view, the first convexo-concave structure 53 may have a line pattern extending in one direction or a line pattern extending in two or more directions. At least one cross section of the first convexo-concave structure 53 in the thickness direction of the light-transmissive substrate 40 may be shaped in a sine-wave curve or a curve represented by a sum of a plurality of sine waves having different amplitudes or angles.

When the first electrode 10 is seen at an upper position and the light-transmissive substrate 40 is seen at a lower position as shown in FIG. 1, the organic compound layer 20 and the first electrode 10 laminated over the inner-light extraction layer 50 are also formed in a shape matching the curve of the first convexo-concave structure 53. Herein, "matching" of the shape means that the shape of each of the organic compound layer 20 and the first electrode 10 may be exactly the same as the curve of the first convexo-concave structure 53 or may be different from the curve of the first convexo-concave structure 53 as slightly as in a tolerable degree in a manufacturing process. For instance, when the organic compound layer 20 and the first electrode 10 are laminated on the second electrode 30 after the formation of the second electrode 30 having a convexo-concave shape, the organic compound layer 20 and the first electrode 10 only need to have a convexo-concave shape similar to that of second electrode 30. The convexo-concave shape of each of the organic compound layer 20 and the first electrode 10 is not necessarily exactly the same as that of the second electrode 30.

The first electrode 10 is also formed in the shape matching the curve of the first convexo-concave structure 53 and includes a second convexo-concave structure 13 having a plurality of second convex portions 11 and a plurality of second concave portions 12.

At least one cross section of the second convexo-concave structure 13 in the thickness direction of the light-transmissive substrate 40 is shaped in a sine-wave curve or a curve represented by a sum of a plurality of sine waves having different amplitudes or angles. The second convexo-concave structure 13 preferably has a cross section shaped in a sine-wave curve. Also in the second convexo-concave structure 13, not only one cross section but also a plurality of cross sections of the second convexo-concave structure 13 in the thickness direction of the light-transmissive substrate 40 may be formed in the above-described curve in the same manner as in the first convexo-concave structure 53. Moreover, in a plan view, the second convexo-concave structure 13 may also have a line pattern extending in one direction or a line pattern extending in two or more directions. At least one cross section of the second convexo-concave structure 13 in the thickness direction of the light-transmissive substrate 40 may be shaped in a sine-wave curve or a curve represented by a sum of a plurality of sine waves having different amplitudes or angles.

In the first exemplary embodiment, a second-convex-portion distance $d_{10}$ between one of second convex portions 11,11A and another of second convex portions 11,11B adjacent to the second convex portions 11,11A in the plurality of second convex portions 11 forming the second convexo-concave structure 13 is equal to or more than a peak wavelength of the radiation light from the emitting layer 21 and is equal to or less than a propagation distance ($L_{sp}$) of surface plasmon (represented by the following numerical formula (1)) at the interface between the first electrode 10 and the organic compound layer 20. Herein, the peak wavelength refers to a wavelength most frequently observed in the radiation light when a spectrum of the radiation light has only a single peak (e.g., the radiation light in a single color), or refers to the longest wavelength among a plurality of peaks in the spectrum of the radiation light when the spectrum has the plurality of peaks (e.g., a white color that is a mixed color of blue, green and red).

Formula 5

$$L_{sp} = 1/Im(2k_{sp}) \quad (1)$$

In the numerical formula (1), Im represents an imaginary part of a complex number.

In the numerical formula (1), $k_{sp}$ represents a wave number of the surface plasmon.

The wave number ($k_{sp}$) of the surface plasmon is represented by a numerical formula (2) below.

Formula 6

$$k_{sp} = \frac{\omega}{c} \times \sqrt{\frac{(\varepsilon_1 \times \varepsilon_2)}{(\varepsilon_1 + \varepsilon_2)}} \quad (2)$$

In the numerical formula (2), ω represents a frequency of light, c represents a speed of the light, $\in_1$ represents a complex permittivity of the organic compound layer 20, and $\in_2$ represents a complex permittivity of the first electrode 10. In the first exemplary embodiment, the complex permittivity $\in_1$ of the organic compound layer 20 specifically refers to a complex permittivity of the second organic layer 23 adjacent to the first electrode 10.

The numerical formula (2) is exemplarily described in a reference document "Plasmonix—Foundation and Application" written by Takayuki Okamonoto and Kotaro Kajikawa, Japan, published by Kodansha, published on Oct. 1, 2010 (ISBN978-4-06-153270-0), page 39.

The propagation distance ($L_{sp}$) of the surface plasmon in an in-plane direction depends on the imaginary part of the wave number ($k_{sp}$) of the surface plasmon and is represented by the numerical formula (1). The numerical formula (1) represents that an electric-field intensity becomes exponentially attenuated as the surface plasmon is propagated. When the second-convex-portion distance $d_{10}$ is larger than the propagation distance ($L_{sp}$) of the surface plasmon, the surface plasmon is converted into heat while being propagated in the in-plane direction.

The propagation distance ($L_{sp}$) of the surface plasmon is about several hundreds μm when the first electrode 10 is made of silver (Ag) and is several tens μm when the first electrode 10 is made of gold (Au). When the first electrode 10 is made of aluminium (Al) often used as an electrode of the organic EL device, a value of $L_{sp}$ obtainable from the numerical formula (1) is about 8 μm at a wavelength of 460 nm, about 10 μm at a wavelength of 530 nm, and about 15 μm at a wavelength of 630 nm. Since the organic electroluminescence device has a multi-layered structure including the metal layer and the dielectric layer, $L_{sp}$ is slightly changed due to the device structure. However, considering that $L_{sp}$ is changed by wavelength dispersion since a width of the emission spectrum is sufficiently broad, the numerical formula (1) is regarded as being satisfied.

A material for the inner-light extraction layer 50 is exemplified by a glass material and a polymer material. For the glass material, materials such as soda-lime glass, barium/strontium-containing glass, lead glass, aluminosilicate glass, borosilicate glass, barium borosilicate glass and quartz can be used. For the polymer material, materials such as polyethylene naphthalate resins, polyimide resins, polycarbonate resins, acrylic resins, polyethylene terephthalate resins, polyethersulfide resins, polysulfone resins, cycloolefin resins and triazine resins can be used.

A refractive index $n_{c2}$ of the inner-light extraction layer 50 is preferably equal to the refractive index of the light-transmissive substrate 40. When the refractive index $n_{c2}$ of the inner-light extraction layer 50 is equal to the refractive index of the light-transmissive substrate 40, a light reflection loss generated at the interface between the light-transmissive substrate 40 and the inner-light extraction layer 50 can be reduced. A typical refractive index of a glass substrate used as the light-transmissive substrate is 1.5. In other materials used as the light-transmissive substrate for the organic EL devices, a relatively lower refractive index is about 1.4, a relatively higher refractive index is about 1.65, and a further higher refractive index is about 2.0. Since the refractive index of the inner-light extraction layer 50 is preferably equal to that of the light-transmissive substrate 40, a difference between the refractive indexes in all wavelength ranges from 380 nm to 780 nm is preferably ±0.3 or less.

Outer-Light Extraction Layer

The outer-light extraction layer 60 (second light extraction layer) radiates the light, which is radiated from the emitting layer 21 and is incident on the light-transmissive substrate 40, to the outside of the device.

The outer-light extraction layer 60 is provided to an opposite surface of the light-transmissive substrate 40 from a surface thereof facing the inner-light extraction layer 50.

As an arrangement of the outer-light extraction layer 60, an arrangement for inhibiting the total reflection such as a diffusive sheet by particulates, microlens array, hemispherical lens, cylindrical lens, microprism and a convexo-concave structure are usable as desired. Since the outer-light extraction layer 60 is interposed at the interface between the light-transmissive substrate 40 and the outside of the substrate, the total reflection at the interface can be prevented, so that a light extraction efficiency can be further improved. As the arrangement for the outer light extraction layer, an arrangement having favorable characteristics is selected as needed according to usage such as display and illumination.

A material for the outer-light extraction layer 60 is exemplified by a glass plate and a polymer plate. For the glass material, materials such as soda-lime glass, barium/strontium-containing glass, lead glass, aluminosilicate glass, borosilicate glass, barium borosilicate glass and quartz can be used. For the polymer material, materials such as polyethylene naphthalate resins, polyimide resins, polycarbonate resins, acrylic resins, polyethylene terephthalate resins, polyethersulfide resins, polysulfone resins, cycloolefin resins and triazine resins can be used. A refractive index $n_{Ext}$ of the outer-light extraction layer 60 is preferably equal to the refractive index of the light-transmissive substrate 40.

Optical Member

The optical member 70 has a circular polarization layer that converts incident light into circular polarized light. In the first exemplary embodiment, the optical member 70 includes a retarder 71 and a polarizer 72, thereby providing a circularly polarizing plate. The circularly polarizing plate prevents reflection of incident light into the device from the outside of the device. In the first exemplary embodiment, the retarder 71 is located to face the light-transmissive substrate 40 and the outer-light extraction layer 60. The polarizer 72 is adjacent to an opposite side of the retarder 71 from the light-transmissive substrate 40 and the outer-light extraction layer 60 and faces the outside of the device. The optical member 70 may be spaced from the outer-light extraction layer 60 with a predetermined interval or may be adjacent to the outer-light extraction layer 60. Alternatively, the outer-light extraction layer 60 may not be provided. When the outer-light extraction layer 60 is not provided, the optical member 70 may be provided adjacent to the light-transmissive substrate 40.

In the first exemplary embodiment, a so-called linear polarizer is used as the polarizer 72 and a quarter-wave plate is used as the retarder 71. Firstly, the polarizer 72 transmits a linear polarized light having a predetermined directional polarization axis included in the incident light from the outside of the device. Subsequently, the transmitted light passes through the retarder 71 to become a circularly polarized light in a predetermined rotational direction. The circularly polarized light is reflected on a surface of the first electrode 10 and the like within the device to become a circularly polarized light having in an opposite rotational direction from the predetermined rotational direction to be absorbed in the retarder 71, so that reflection of the light to the outside of the device is prevented.

On the other hand, when light-diffusive particulates or a random convexo-concave structure is used as the light extraction structure, the polarization direction of the incident light from the outside of the device and the polarization direction of the light reflected on the device are different. Accordingly, the retarder 71 is likely to transmit the light, so that the reflected light is transmitted to the outside of the device.

It should be noted that the optical member 70 is not limited to the circularly polarizing plate.

Relationship Between Second Convexo-Concave Structure and Surface Plasmon

As described above, the second convexo-concave structure 13 is a cyclic convexo-concave structure defined by a predetermined second-convex-portion distance $d_{10}$.

Figure 2:
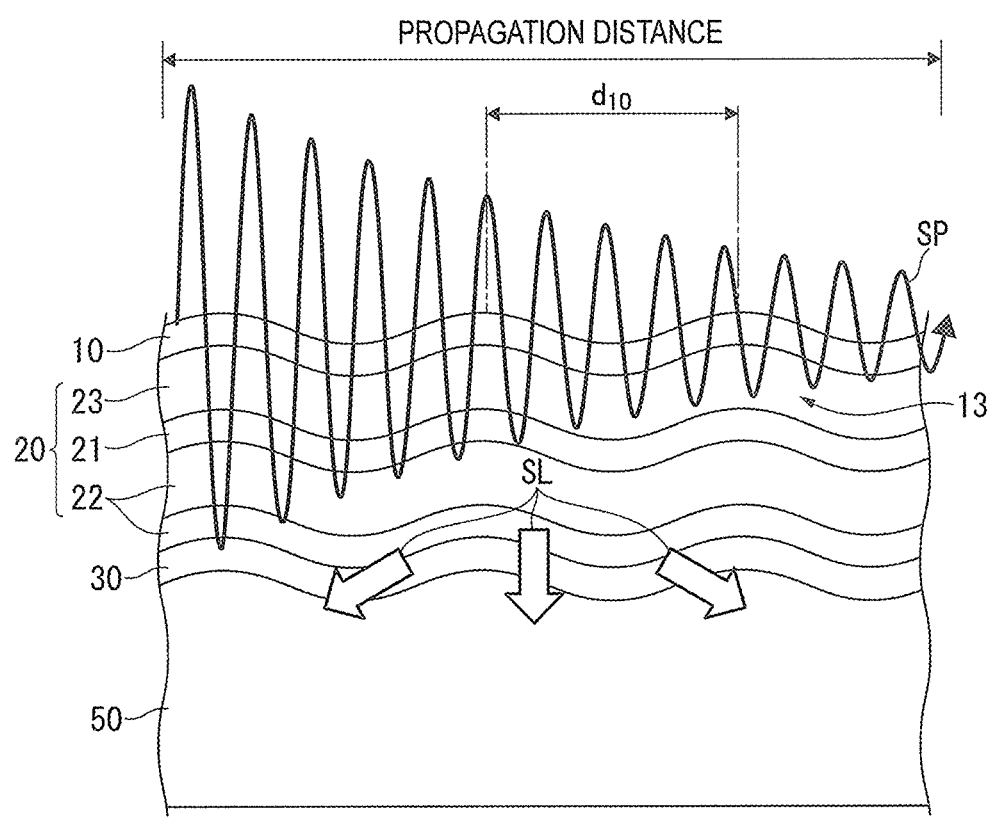
FIG. 2 is the schematic cross-sectional view of the above organic EL device overlapped with a wave schematically showing a scattering condition of surface plasmon at an interface between a first electrode and an organic compound layer.

FIG. 2 is a schematic cross-sectional view of the above organic EL device 1 overlapped with the wave schematically showing a scattering condition of the surface plasmon on the interface between the first electrode 10 and the second organic layer 23 in the organic EL device 1 according to the first exemplary embodiment. Thus, the wave schematically showing the scattering condition of the surface plasmon is not a part of the schematic cross-sectional view. It should be noted that hatching expressing the cross section is omitted in FIG. 2.

As shown in FIG. 2, in the organic EL device 1 in the first exemplary embodiment, the second-convex-portion distance $d_{10}$ is equal to or more than a main wavelength of the light radiated from the emitting layer 21 and is equal to or less than the propagation distance of the surface plasmon SP. The surface plasmon SP propagating in the in-plane direction collides with the second convexo-concave structure 13 to change the interface (interface condition). Due to such a change of the interface condition, a part of the light in the surface plasmon mode can be scattered to be radiated to the outside of the device as scattered light SL.

Figure 3:
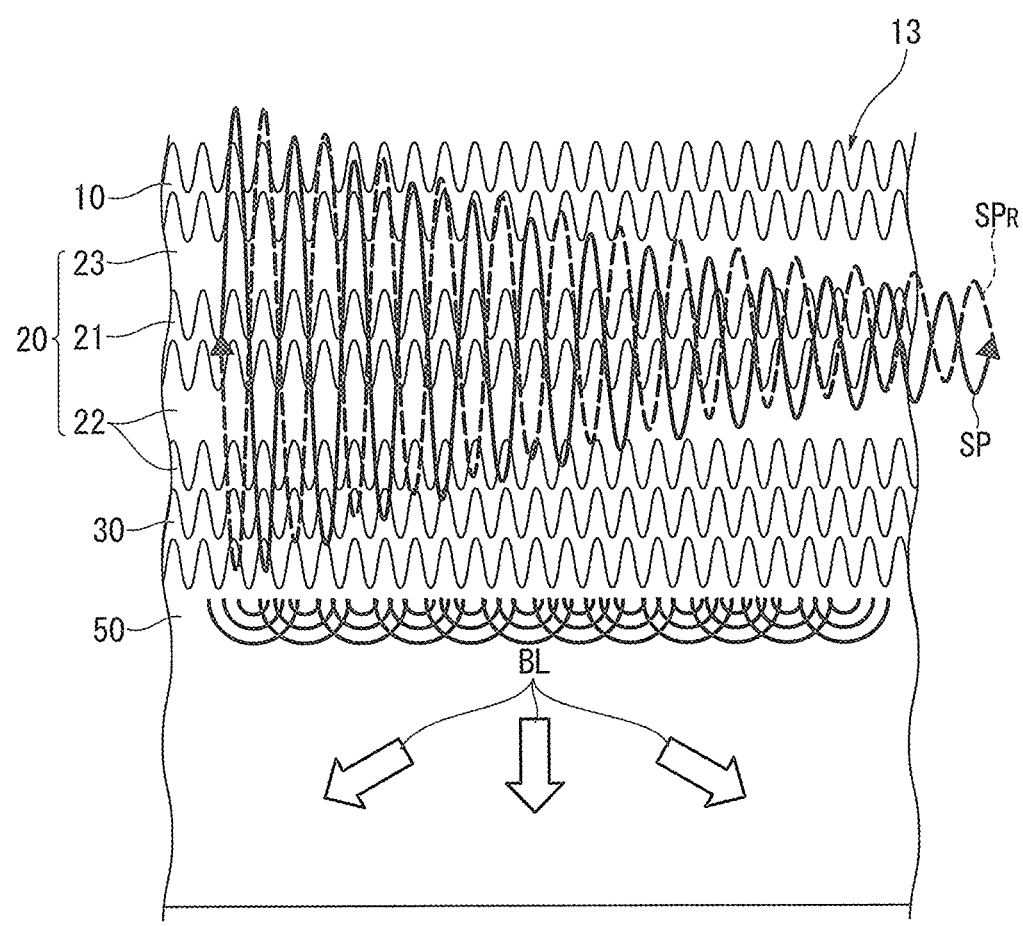
FIG. 3 is a schematic cross-sectional view of an organic EL device, unlike the above organic EL device, having a convexo-concave structure formed at the interface between the first electrode and the organic compound layer, in which a distance between convex portions is less than a main wavelength of the light radiated from the emitting layer, the cross-sectional view overlapped with a wave schematically showing propagation of surface plasmon at the above interface.

On the other hand, as shown in FIG. 3, when the distance between the convex portions of the convexo-concave structure formed at the interface between the first electrode 10 and the second organic layer 23 is less than the main wavelength of the light radiated from the emitting layer 21, for instance, when Bragg diffraction occurs, the surface plasmon SP and reflection wave $SP_R$ of the surface plasmon are overlapped with each other to become a standing wave, so that Bragg diffracted light BL is radiated to the outside of the device. In such a Bragg diffraction, zero-order diffracted light is radiated toward a front surface of the device. Further, the diffracted light (e.g., plus-minus first-order diffracted light) is occasionally radiated in direction diagonal to a normal line of an emitting surface.

Figure 4:
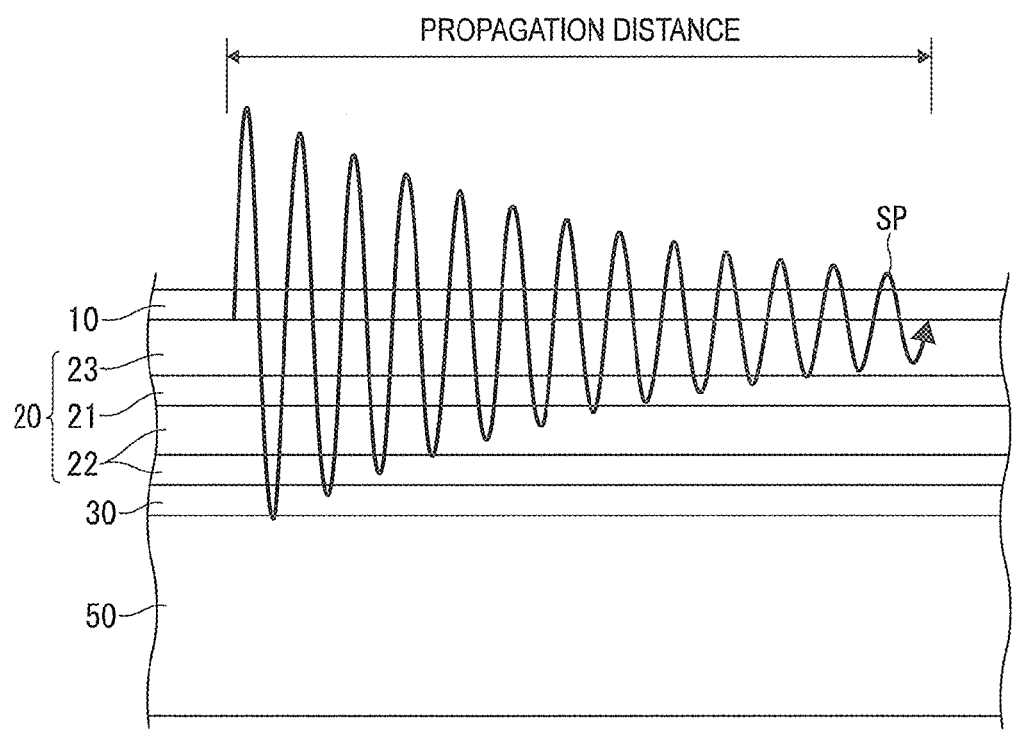
FIG. 4 is a schematic cross-sectional view of an organic EL device, unlike the above organic EL device, having a convexo-concave structure formed at the interface between the first electrode and the organic compound layer, in which the distance between the convex portions is more than the propagation distance of surface plasmon, the cross-sectional view overlapped with a wave schematically showing propagation of the surface plasmon on the above interface.

Moreover, as shown in FIG. 4, when the distance between the convex portions of the convexo-concave structure formed at the interface between the first electrode 10 and the second organic layer 23 is larger than the propagation distance of the surface plasmon SP, for instance, when the distance between the convex portions is sufficiently large to provide a substantially flat convexo-concave structure, the surface plasmon SP propagating in the in-plane direction does not collide with the convexo-concave structure to keep the interface condition unchanged, so that the surface plasmon SP is converted into heat while being propagated in the in-plane direction.

The emitting layer 21 is occasionally provided by the laminate of emitting layers each capable of emitting light, as described above. In this case, a lower limit of the second-convex-portion distance $d_{10}$ is defined based on the largest one of main wavelengths (peak wavelengths) of the lights respectively radiated from the plural emitting layers. For instance, when a red emitting layer, a green emitting layer and a blue emitting layer are laminated to make the organic EL device emit white light by synthesizing emission colors in red, green and blue, since a peak wavelength of the red emission is the largest, it is preferable to define the lower limit of the second-convex-portion distance $d_{10}$ based on the peak wavelength of red emission.

Accordingly, in the first exemplary embodiment, it is preferable that the second-convex-portion distance $d_{10}$ is equal to or more than 600 nm and is equal to or less than the propagation distance ($L_{sp}$) of the surface plasmon. Thus, by defining the lower limit of the second-convex-portion distance $d_{10}$ based on the peak wavelength of red emission, the radiation light can be efficiently extracted to the outside of the device even in the device emitting white light.

Moreover, in the first exemplary embodiment, it is preferable that the second-convex-portion distance $d_{10}$ is equal to or more than a coherence length of the light radiated from the emitting layer 21 and is equal to or less than the propagation distance ($L_{sp}$) of the surface plasmon.

When the second-convex-portion distance $d_{10}$ is equal to or more than the coherence length, a diffraction effect of Bragg diffraction resonance is weakened, thereby improving extraction of the radiation light to the outside of the device in the whole wavelength ranges and whole angles. When the peak wavelength of the red emission is 600 nm, since the distance between the convex portions of about three times as large as the peak wavelength of red emission is enough for the second-convex-portion distance $d_{10}$ to be equal to or more than the coherence length, the lower limit of the second-convex-portion distance $d_{10}$ is 1.8 μm. In the first exemplary embodiment, the coherence length (optical coherence distance) is defined by (coherence length)=$\lambda^2/\Delta\lambda$. Herein, $\lambda$ represents a peak wavelength of emission spectrum of radiation light generating in the organic emitting layer and $\Delta\lambda$ represents a half bandwidth of the peak wavelength of the emission spectrum. The light is an electromagnetic wave and can be considered as a "continuous wave." A length of this continuous wave is referred to as the coherence length. A coherence length of natural light having a wide spectrum is about several microns (equal to a total of several wavelengths) while a coherence length of light having a narrow spectrum width (e.g., laser beam) is occasionally several kilometers. Two light waves having spatial deviation within the coherence length mutually interfere. However, when spatial deviation of two light waves is equal to or more than the coherence length, the two light waves do not interfere. For this reason, by setting the lower limit of the second-convex-portion distance $d_{10}$ at 1.8 μm, a diffraction effect of Bragg diffraction resonance is weakened, thereby improving extraction of the radiation light to the outside of the device in the whole wavelength ranges and whole angles.

Further, in the first exemplary embodiment, it is preferable that the second-convex-portion distance $d_{10}$ is equal to or more than four times as large as the radiation light from the emitting layer 21 and is equal to or less than the propagation distance ($L_{sp}$) of the surface plasmon. With the second-convex-portion distance $d_{10}$ as described above, a diffraction effect of Bragg diffraction resonance is further weakened, thereby improving extraction of the radiation light to the outside of the device in the whole wavelength ranges and whole angles. When the peak wavelength of the red emission is 600 nm, the lower limit of the second-convex-portion distance $d_{10}$ is 2.4 μm or more, which is four times as large as the peak wavelength of the red emission.

Manufacturing Method of Organic EL Device

Formation of Light Extraction Layer

Firstly, a low refractive material for the inner-light extraction layer 50 is uniformly coated on the light-transmissive substrate 40. Here, a resist material (e.g., a resist material manufactured by Nippon Steel Chemical Co., Ltd.) is used as the low refractive material. Next, a heated mold is pressed onto the low refractive material to soften the low refractive material, whereby the convexo-concave structure is transferred to the low refractive material (heat imprint). As the mold for forming the inner-light extraction layer 50, a mold formed with a concave shape, which is an inverse of the shape and the arrangement pattern of the first convexo-concave structure 53, is usable.

After the transfer of the convexo-concave structure, the low refractive material is exposed to ultraviolet ray to be cured. After heated at a predetermined temperature for a predetermined time (e.g., 180 degrees C. for 30 minutes), the mold and the low refractive material are cooled down to about the room temperature. By removing the mold, the inner-light extraction layer 50 is formed on the light-transmissive substrate 40.

On the other hand, the outer-light extraction layer 60 can be formed by various methods depending on a structure of the outer-light extraction layer 60. Herein, the outer-light extraction layer 60 having a convexo-concave structure is exemplarily described.

A mold formed with a concave shape, which is an inverse of the convexo-concave shape and the arrangement pattern of the outer-light extraction layer 60, is heated. The heated mold is pressed on a thermoplastic resin film formed of the material for the outer-light extraction layer 60 to soften the thermoplastic resin, whereby the shape of the mold is transferred to the thermoplastic resin (heat imprint). Subsequently, the mold and the thermoplastic resin are cooled down to about the room temperature. When a photo-curable resin is used, curing by ultraviolet exposure is further performed and then the mold is removed, thereby forming the outer-light extraction layer 60.

Formation of Organic Emitting Layer and Electrode

The second electrode 30, organic compound layer 20 and first electrode 10 are sequentially laminated on the inner-light extraction layer 50 formed with the first convexo-concave structure 53. Here, the second electrode 30, organic compound layer 20 and first electrode 10 are formed to have a shape matching the first convexo-concave structure 53.

In order to form the first electrode 10 and the second electrode 30, vacuum evaporation, sputtering and the like may be employed. In order to form the organic compound layer 20, dry film-forming such as vacuum deposition, sputtering, plasma or ion plating and wet film-forming such as spin coating, dipping, flow coating or ink-jet may be employed.

Next, the above thermoplastic resin film formed with the outer-light extraction layer 60 is pasted to a surface of the light-transmissive substrate 40 (i.e., an opposite surface from a surface on which the inner-light extraction layer 50 is formed). For instance, an adhesive agent having a refractive index equal to that of the outer-light extraction layer 60 may be used for pasting. An optical adhesive agent such as an acrylic adhesive agent or epoxy adhesive agent may be used for pasting the outer-light extraction layer 60 to the light-transmissive substrate 40.

As described above, the organic EL device 1 can be obtained. It should be noted that, after pasting the outer-light extraction layer 60 to the light-transmissive substrate 40, the organic EL layers (e.g., the inner-light extraction layer 50, second electrode 30, organic compound layer 20 and first electrode 10) may be formed.

Advantages of First Exemplary Embodiment

According to the first exemplary embodiment as described above, the following advantages can be obtained.

In the organic EL device 1, the first electrode 10 has the second convexo-concave structure 13 at the interface with the second organic layer 23. The second convexo-concave structure 13 is shaped in a sine-wave curve or a curve represented by a sum of a plurality of sine waves having different amplitudes or angles. The second-convex-portion distance $d_{10}$ of the second convexo-concave structure 13 is equal to or more than the peak wavelength of the light radiated from the emitting layer 21 and is equal to or less than the propagation distance ($L_{sp}$) of the surface plasmon at the interface between the first electrode 10 and the second organic layer 23.

According to the organic EL device 1 having the above arrangement, the light in the surface plasmon mode propagated in the in-plane direction of the organic EL device 1 is scattered to be extracted to the outside of the device as scattering light.

Moreover, in the organic EL device in which a convexo-concave shape causing Bragg diffraction is formed on the interface of the first electrode, strong wavelength dependency and angle dependency are observed and highly directional light is radiated. However, according to the organic EL device 1, the second-convex-portion distance $d_{10}$ of the second convexo-concave structure 13 satisfies the above condition, so that light with inhibited directionality can be radiated.

From the above, according to the organic EL device 1, the light extractable to the outside of the device can be increased by converting the light in the surface plasmon mode into propagation light. Consequently, the directionality of the radiation light can be lowered and an external quantum efficiency can be improved.

Moreover, since the organic EL device 1 includes the inner-light extraction layer 50 and the outer-light extraction layer 60, light in a thin-film mode and light in a substrate mode can be efficiently radiated to the outside of the device. Consequently, the external quantum efficiency can be improved.

Moreover, by providing the optical member 70, reflection of the incident light from the outside of the organic EL device 1 can be efficiently prevented to improve contrast. Consequently, when the organic EL device 1 is used for a display device, the display device capable of a highly contrast display can be provided.

Second Exemplary Embodiment

Next, a second exemplary embodiment of the invention will be described.

In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

In the organic EL device 1 of the first exemplary embodiment, both of the first electrode 10 and the second electrode 30 have the above convexo-concave structure. However, in an organic EL device of a second exemplary embodiment, either one of the first electrode 10 and the second electrode 30 may have a convexo-concave structure.

In this arrangement, it is preferable that an electrode (the first electrode 10 in the second exemplary embodiment) in an opposite direction from an extraction direction of the light radiated from the emitting layer 21 (a direction toward the light-transmissive substrate 40 from the emitting layer 21) has the same convexo-concave structure as the second convexo-concave structure 13 described in the first exemplary embodiment.

On the other hand, in an organic EL device in which the extraction direction of light radiated from the emitting layer 21 is a direction toward the first electrode 10 from the emitting layer 21, the second electrode 30 in an opposite direction from the extraction direction of the radiation light may have the same convexo-concave structure as the second convexo-concave structure 13 at the interface with the organic compound layer 20.

According to the organic EL device of the second exemplary embodiment, the light extractable to the outside of the device can be increased by converting the light in the surface plasmon mode into propagation light in the same manner as in the organic EL device of the first exemplary embodiment. Consequently, the directionality of the radiation light can be lowered and the external quantum efficiency can be improved.

In the organic EL device of the second exemplary embodiment, the optical member 70 may be provided in the same direction as the light extraction direction. When the light extraction direction is the direction from the emitting layer 21 toward the light-transmissive substrate 40, the optical member 70 may be provided at the same position as in the first exemplary embodiment. On the other hand, when the light extraction direction is the direction from the emitting layer 21 toward the first electrode 10, the optical member 70 may be positioned to face the first electrode 10.

Thus, by providing the optical member 70 also in the second exemplary embodiment, reflection of the incident light from the outside of the organic EL device 1 can be efficiently prevented to improve contrast in the same manner as in the first exemplary embodiment. Consequently, with the organic EL device of the second exemplary embodiment, a display device capable of achieving a highly contrast display can be provided.

Modifications of Embodiment(s)

It should be noted that the invention is not limited to the above exemplary embodiment but may include any modification and improvement as long as such modification and improvement are compatible with the invention.

In the above exemplary embodiments, the organic EL device having the outer-light extraction layer 60 is described as an example, but the arrangement of the organic EL device is not limited thereto. For instance, the optical member 70 may be provided to an opposite surface of the light-transmissive substrate 40 from a surface thereof facing the inner-light extraction layer 50 without the outer-light extraction layer 60.

Moreover, in the above exemplary embodiments, the organic EL device having the optical member 70 is described as an example, but the arrangement of the organic EL device is not limited thereto. For instance, only the outer-light extraction layer 60 may be provided on the opposite surface of the light-transmissive substrate 40 from the surface thereof facing the inner-light extraction layer 50.

The organic EL device of the invention is suitably applicable to an electronic device such as: a display device of a television, a mobile phone, a personal computer and the like; and an emitting unit of an illuminator or a vehicle light. When the organic EL device is used for a display device, the organic EL device can provide a highly contrast display by including the optical member 70.

EXAMPLES

Next, the invention will be described in further detail by exemplifying Example(s) and Comparative(s). However, the invention is not limited by the description of Example(s).

Example 1

Firstly, a low refractive material for the inner-light extraction layer was uniformly coated on the light-transmissive substrate (glass substrate) to form a film. In Example 1, a resist material (product name: NEX-907I manufactured by Nippon Steel Chemical Co., Ltd.) was used as the low refractive material. Next, a heated mold was pressed onto the low refractive material to soften the low refractive material, whereby the convexo-concave structure of the mold was transferred to the low refractive material (heat imprint). As the first convexo-concave structure in Example 1, a wavy line pattern having a cyclic structure in a sine wave and extending in one direction was used. The first convexo-concave structure was formed in a wavy line pattern having a cyclic structure in a sine wave and extending in one direction so that the second convexo-concave structure to be laminated on the first convexo-concave structure had a 2-µm second-convex-portion distance. Accordingly, as the mold for forming the inner-light extraction layer, a mold formed with a concave shape, which was an inverse of the shape and the arrangement pattern of the first convexo-concave structure, was used.

After the transfer of the convexo-concave structure, the low refractive material was exposed to ultraviolet ray to be cured. After the cured low-refractive material was heated at a predetermined temperature (180 degrees C.) for a predetermined time (30 minutes), the mold and the low refractive material were cooled down to about the room temperature. By removing the mold, the inner-light extraction layer was formed on the light-transmissive substrate.

Next, on the surface of the inner-light extraction layer on which the first convexo-concave structure was formed, IZO was deposited to form an IZO film having a 110-nm thickness as a transparent electrode (second electrode). As the glass substrate (light-transmissive substrate), a glass substrate (NA35 manufactured by Nippon Sheet Glass co., Ltd.) having a size of 25 mm×25 mm×0.7 mm thick and a refractive index of 1.50 (wavelength=550 nm) was used.

A hole injecting compound was deposited on the IZO film to form a 10-nm thick hole injecting layer.

A hole transporting compound was deposited on the hole injecting layer to form an 85-nm thick first hole transporting layer.

A hole transporting compound was deposited on the first hole transporting layer to form a 30-nm thick second hole transporting layer.

A compound (a host material) and a compound (a blue fluorescent dopant material) were co-deposited on the second hole transporting layer to form a 30-nm thick emitting layer. A concentration of the compounds in the emitting layer was 5 mass %. The maximum luminous peak wavelength of the compounds was 465 nm.

A compound was deposited on the emitting layer to form a 10-nm thick hole blocking layer.

An electron transporting compound was deposited on the hole blocking layer to form a 20-nm thick electron transporting layer.

LiF was deposited on the electron transporting layer at a film formation speed of 0.1 angstrom/min to form a 1-nm thick LiF film as an electron-injecting electrode (cathode).

A metal Al was deposited on the LiF film to form an 80-nm thick metal cathode.

Next, a hemispherical lens (diameter: 4 mm) as the outer-light extraction layer was pasted to an opposite surface of the light-transmissive substrate (glass substrate) from the surface thereof on which the inner-light extraction layer was formed. The hemispherical lens was pasted using immersion oil (manufactured by Edmund Optics Inc.: refractive index of 1.5).

Thus, the organic EL device of Example 1 was manufactured.

Figure 5A:
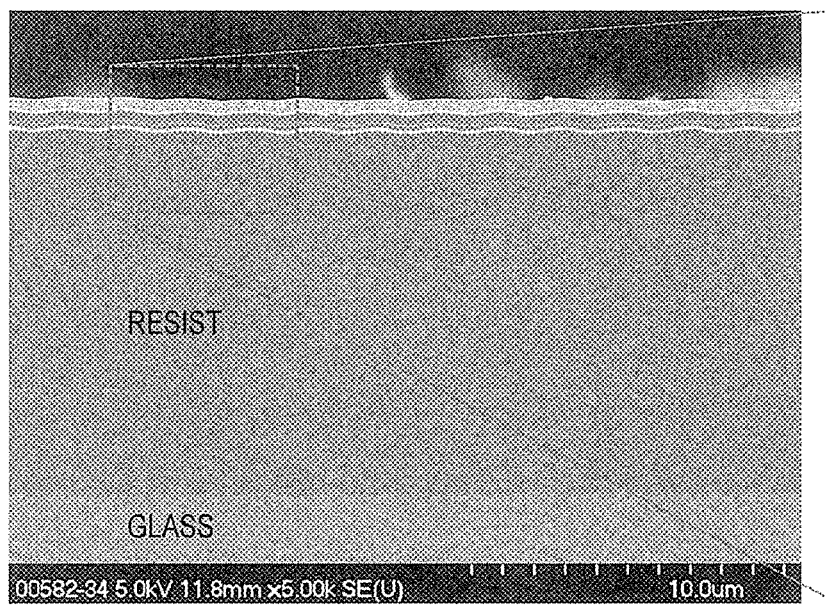
FIG. 5A shows a cross-sectional SEM image of the organic EL device.
Figure 5B:
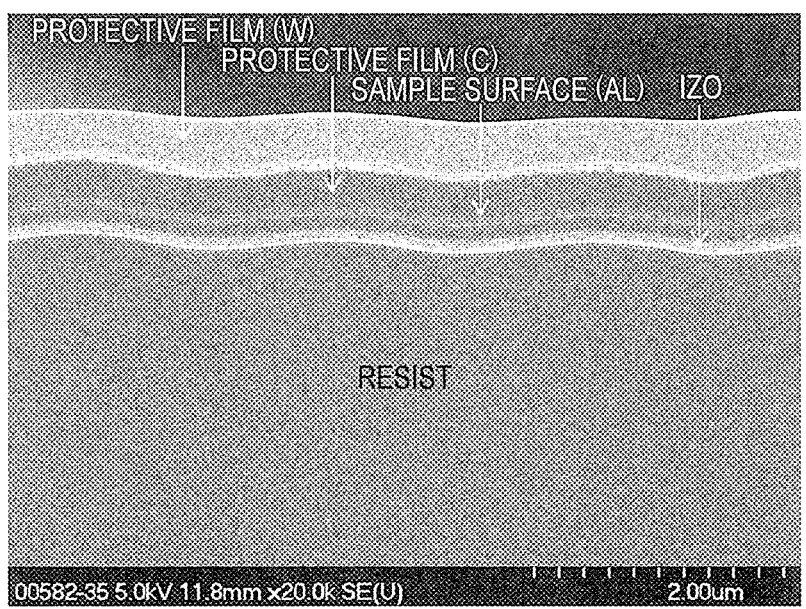
FIG. 5B shows another cross-sectional SEM image of the organic EL device.

FIG. 5 shows a cross-sectional SEM image of the organic EL device in Example 1. FIG. 5B shows an enlarged part of FIG. 5A. The SEM image was observed using a scanning electron microscope manufactured by Hitachi, Ltd.

In FIG. 5, glass corresponds to the light-transmissive substrate, the resist material corresponds to the inner-light extraction layer, IZO corresponds to the second electrode, and the sample surface (AL) corresponds to the first electrode. In order to protect the organic EL device during SEM observation, a protective film (C) and a protective film (W) were sequentially laminated on the first electrode.

As shown in FIG. 5B, the second convexo-concave structure of the first electrode matching the first convexo-concave structure of the inner-light extraction layer was formed. The second-convex-portion distance of the second convexo-concave structure was 2 μm.

Comparative 1

In Comparative 1, an organic EL device was manufactured in the same manner as in the organic EL device of Example 1 except that the inner-light extraction layer and the outer-light extraction layer were not formed.

Driving Test

As for conditions of a driving test on the organic EL devices, voltage was applied on each of the organic EL devices such that a current density was 10 mA/cm², and EL emission spectrum at that time was measured using a spectroradiometer (CS-1000 manufactured by Konica Minolta, Inc.) and a light distribution measuring device (IMS-5000 manufactured by Asahi Spectra Co., Ltd.).

An electrical power efficiency η (unit: lm/W) of whole beams was calculated based on results of spectral radiance spectra (wavelength from 380 nm to 780 nm) measured by the aforementioned spectroradiometer when voltage was applied on each of the organic EL devices such that the current density was 10 mA/cm² and results of angularly-resolved spectrum measured by the light distribution measuring device.

The external quantum efficiency (unit: %) was also measured, thereby calculating a value of the whole beams.

Table 1 shows a ratio of values of the electrical power efficiency of the organic EL devices in Example 1 and Comparative 1 relative to the value of the electrical power efficiency of the organic EL device in Comparative 1. Table 1 also shows a ratio of values of the external quantum efficiency of the organic EL devices in Example 1 and Comparative 1 relative to the value of the external quantum efficiency of the organic EL device in Comparative 1.

TABLE 1

|  | electrical power efficiency | external quantum efficiency |
|---|---|---|
| Example 1 | 2.03 | 1.75 |
| Comparative 1 | 1.00 | 1.00 |

As shown in Table 1, the organic EL device of Example 1 was superior to the organic EL device of Comparative 1 in the current efficiency and the external quantum efficiency.

Outside Light Contrast Test

The optical member was attached to a side of the organic EL device from which the light was extracted (i.e., near the light-transmissive substrate away from the first electrode in the exemplary embodiments). A reflection ratio of outside light incident on the organic EL device was measured. The reflection ratio was measured at nine positions.

A circularly polarizing plate 27352-L manufactured by Edmund Optics Inc. was used. Reflection spectrum was measured by MCPD-1000UV-VIS spectroscope manufactured by OTSUKA ELECTRONICS CO., LTD. Using a halogen lamp as a light source, white light perpendicularly entered a device surface through a Y-branch optical fiber. Reflection light in the perpendicular direction was detected.

Figure 6:
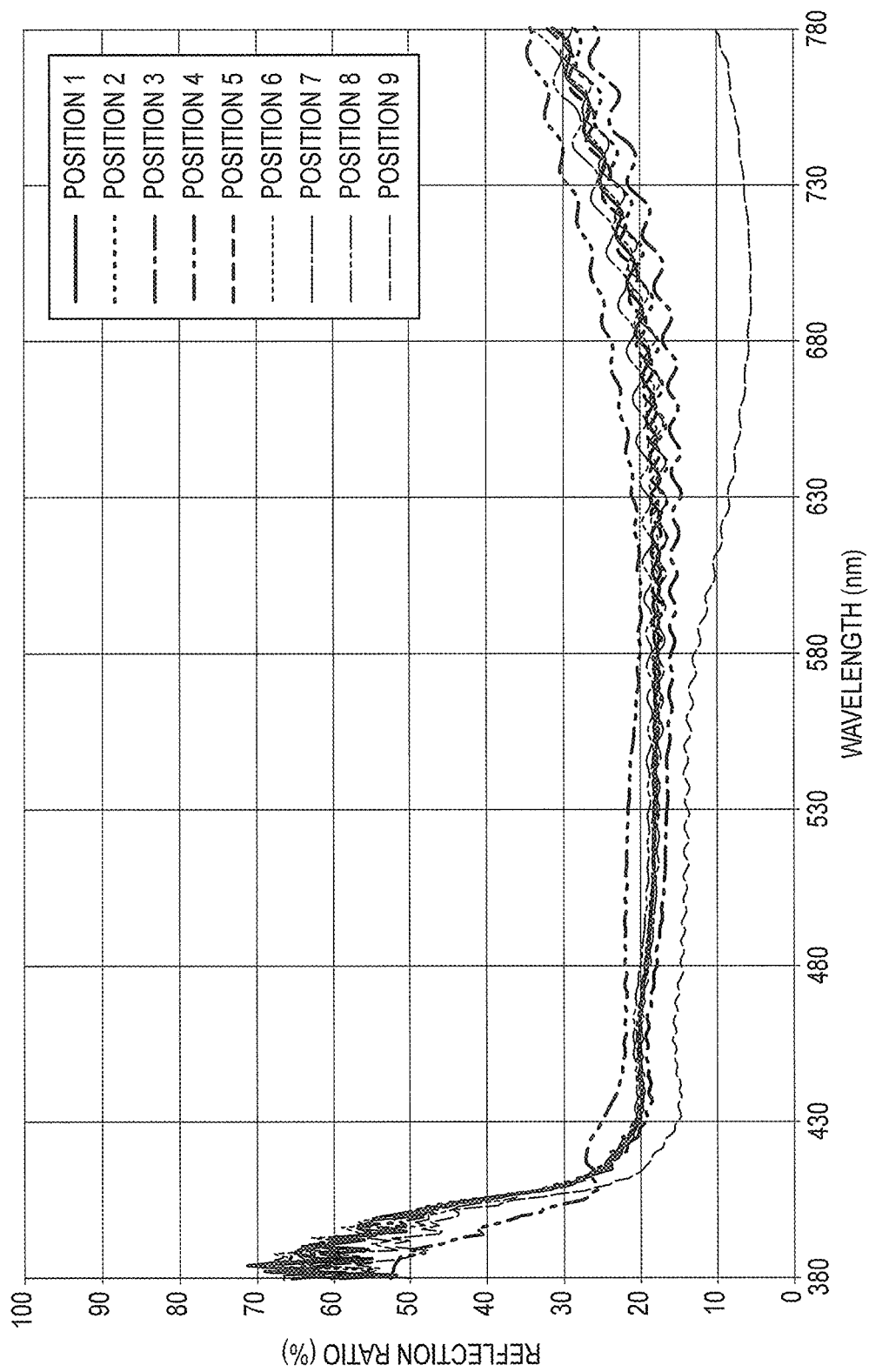
FIG. 6 is a graph showing results of an outside light contrast test of the organic EL device in Example.

FIG. 6 shows measurement results of the organic EL device in Example 1. As shown in FIG. 6, it was found about the organic EL device of Example 1 that the reflection ratios measured at the nine positions (position 1 to position 9) were as low as about 20% in the visible wavelengths of 420 nm to 680 nm although the second convexo-concave structure was formed on the first electrode, thereby allowing a highly contrast display.

Figure 7:
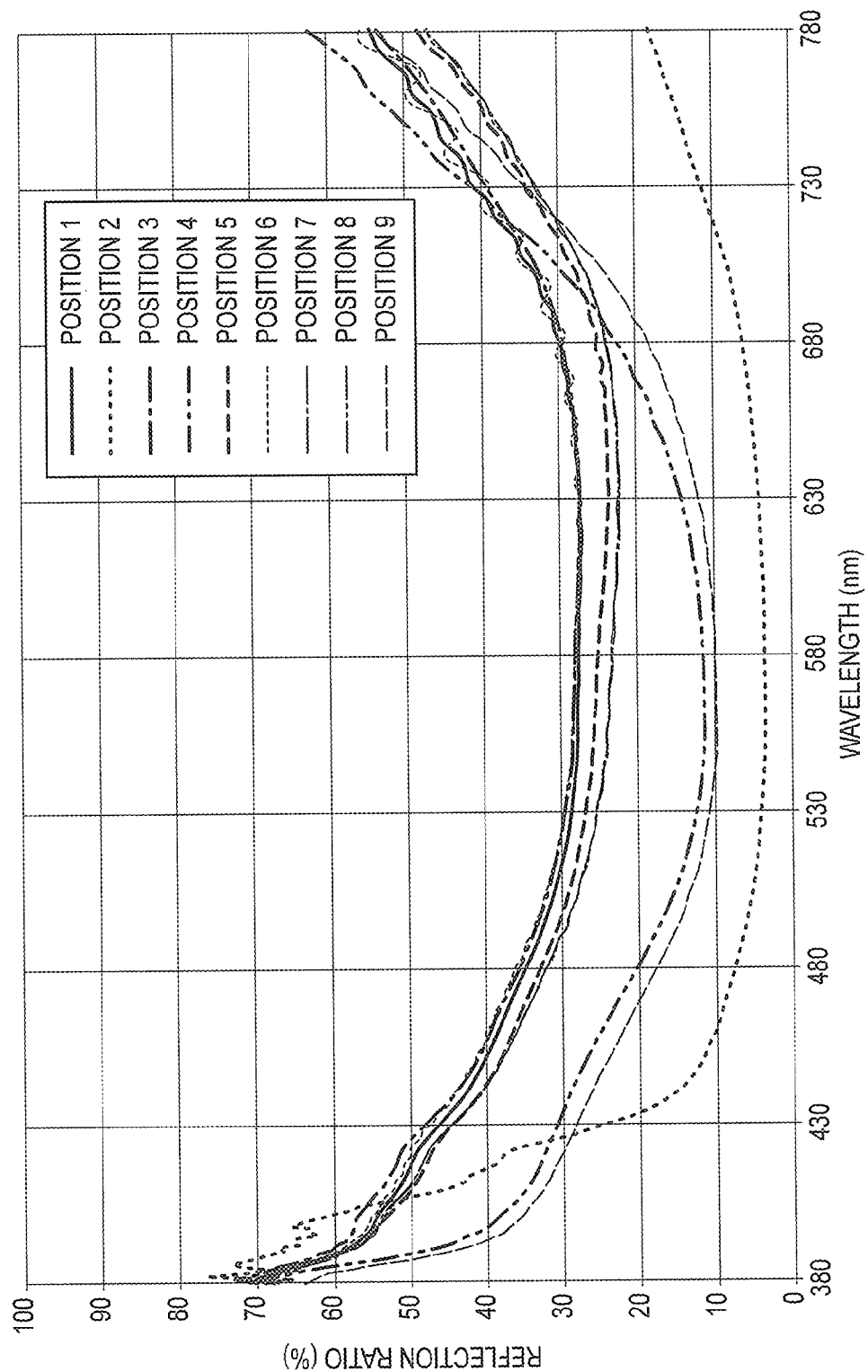
FIG. 7 is a graph showing results of an outside light contrast test of the organic EL device in Comparative.

FIG. 7 shows results of measuring an organic EL device of Comparative 1A in the same manner as described above, in which the inner-light extraction layer dispersed with scattering particulates was interposed between the light-transmissive substrate and the second electrode in the arrangement of the organic EL device of Comparative 1. As shown in FIG. 7, it was found about the organic EL device of Comparative 1A that the reflection ratios were as high as about 30% in the visible wavelengths of 420 nm to 680 nm to provide a contrast display lower than that of the organic EL device of Example 1.

Example 2

The same inner-light extraction layer as in Example 1 was formed on the light-transmissive substrate. Next, on the surface of the inner-light extraction layer where the first convexo-concave structure was formed, IZO was deposited to form a 110-nm thick IZO film as a transparent electrode (second electrode). As the glass substrate (light-transmissive substrate), a glass substrate (NA35 manufactured by Nippon Sheet Glass co., Ltd.) having a size of 25 mm×25 mm×0.7 mm thick and a refractive index of 1.50 (wavelength=550 nm) was used.

A hole injecting compound was deposited on the IZO film to form a 5-nm thick hole injecting layer.

A hole transporting compound was deposited on the hole injecting layer to form a 120-nm thick first hole transporting layer. A hole transporting compound was deposited on the first hole transporting layer to form an 85-nm thick second hole transporting layer.

Further, a compound PH-100 (a host material) and a compound Ir(ppy)$_3$ (a green phosphorescent dopant material) were co-deposited on the second hole transporting layer to form a 45-nm thick emitting layer. A concentration of the dopant material in the emitting layer was 5 mass %. The maximum luminous peak wavelength of the compound Ir(ppy)$_3$ was 519 nm.

A 5-nm thick hole blocking layer was formed on the emitting layer by deposition.

An electron transporting compound was deposited on the hole blocking layer to form a 10-nm thick electron transporting layer.

LiF was deposited on the electron transporting layer at a film formation speed of 0.1 angstrom/min to form a 1-nm thick LiF film as an electron-injecting electrode (cathode).

A metal Al was deposited on the LiF film to form an 80-nm thick metal cathode.

Comparative 2

In Comparative 2, an organic EL device was manufactured in the same manner as in the organic EL device of Example 2 except that the inner-light extraction layer and the outer-light extraction layer were not formed.

Driving Test

The organic EL devices of Example 2 and Comparative 2 were tested in the same manner as described above. The results are shown in Table 2. Similar to Table 1, Table 2 shows a ratio of measurement values of Example 2 and Comparative 2 to the value of Comparative 2.

TABLE 2

| | electrical power efficiency | external quantum efficiency |
|---|---|---|
| Example 2 | 2.30 | 2.00 |
| Comparative 2 | 1.00 | 1.00 |

As shown in Table 2, the organic EL device of Example 2 was superior to the organic EL device of Comparative 2 in the current efficiency and the external quantum efficiency.

Figure 8:
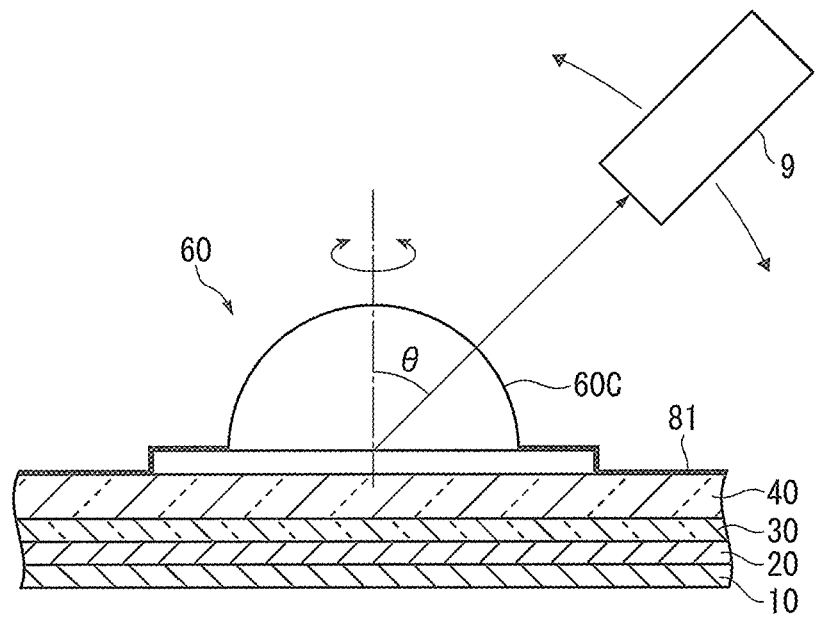
FIG. 8 schematically shows an evaluation method of a distribution of light radiated from the organic EL device.

FIG. 8 schematically shows an evaluation method of a distribution of light radiated from the manufactured organic EL device.

Using the light distribution measuring device IMS-5000 manufactured by Asahi Spectra Co., Ltd., light distribution of radiation light from the light extraction surface of the manufactured organic EL device was measured while an angle of the light receiver 9 was changed. As shown in FIG. 8, a normal direction of a surface of the light-transmissive substrate 40 was defined as θ=0 degree. In a range of −90 degrees≤θ≤90 degrees and −180 degrees≤ϕ≤180 degrees (ϕ represents an in-plane rotation angle), a measurement position of the light receiver 9 was changed every five degrees of each of θ and ϕ. EL emission spectrum was measured at every five degrees of each of θ and ϕ. The organic EL device was driven at the current density of 10 mA/cm$^2$ to measure the whole beams.

FIG. 8 schematically shows a measurement method of the organic EL device 2 of Comparative 2. Specifically, the inner-light extraction layer was not formed and the convexo-concave structure was not formed on the first electrode 10.

On the light extraction surface of the light-transmissive substrate 40, a light-shielding mask 81 having a circular aperture, a diameter of which was equal to a diameter (4 mm) of a hemispherical projection 60C of the outer-light extraction layer 60, was provided. An emitting area of the organic EL device was 10 mm×10 mm. An aperture having a 4-mm diameter was provided at a center of the light-shielding mask 81. The immersion oil having the refractive index of 1.5 was filled in the aperture. The light-transmissive substrate 40 was pasted to the outer-light extraction layer 60. A diameter of the detection area of the light receiver 9 in the light distribution measuring device was 10 mm. Only emission through the 4-mm diameter aperture was measured by the 10-mm diameter detection area.

Figure 9A:
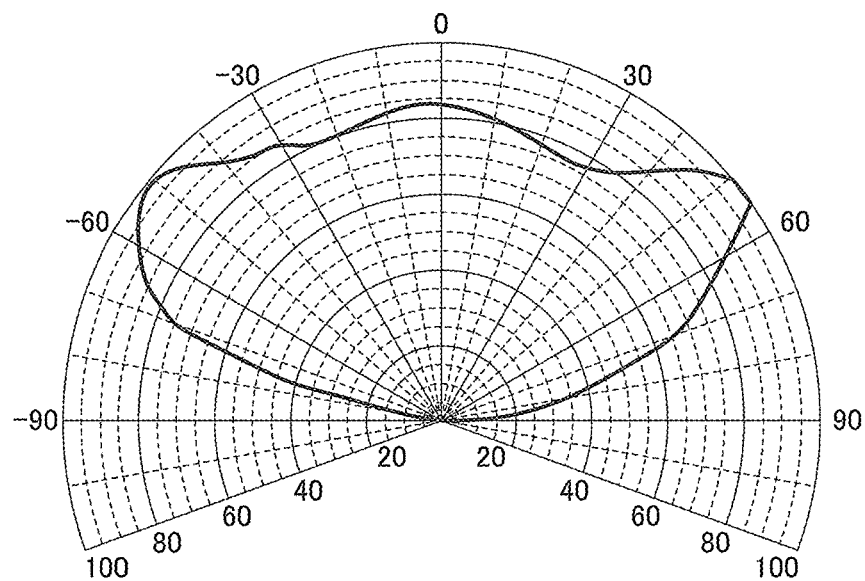
FIG. 9A schematically shows a distribution of light radiated from the organic EL device in Example.
Figure 9B:
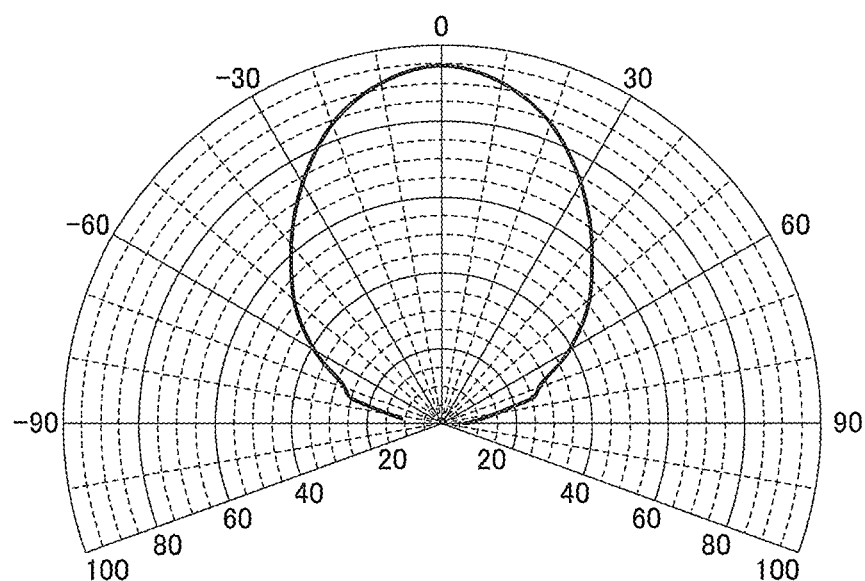
FIG. 9B schematically shows a distribution of light radiated from the organic EL device in Comparative.

Also in Example 2, the same light-shielding mask 81 was provided in measurement. In short, light distribution on the same emitting area was measured in Example 2 and Comparative 2. FIG. 9A illustrates the light distribution of Example 2. FIG. 9B illustrates the light distribution of Comparative 2.

As shown in FIG. 9A, the organic EL device of Example 2 does not radiate zero-order diffracted light from the front surface, but radiates light expanding to higher-degree angles. Since expansion of the radiation light to the higher-degree angles is not in a sharp form, the radiation light is not the first-order diffracted light of Bragg diffraction. Accordingly, in the organic EL device of Example 2, it is considered that the light in the surface plasmon mode is converted into propagation light not by Bragg diffraction but by scattering phenomenon because of the second convexo-concave structure of the first electrode.

The invention claimed is:

1. An organic electroluminescence device comprising:
a first electrode;
a second electrode facing the first electrode;
an organic compound layer provided between the first electrode and the second electrode, the organic compound at least comprising an emitting layer; and
a light-transmissive substrate provided to an opposite surface of the second electrode from a surface of the second electrode facing the first electrode, wherein
the first electrode and the second electrode each have a convexo-concave structure including a plurality of convex portions and a plurality of concave portions at an interface with the organic compound layer,
the convexo-concave structure of each of the first electrode and the second electrode has at least one cross section in a thickness direction of the light-transmissive substrate, the cross section being shaped in a sine-wave curve or a curve of a sum of a plurality of sine waves having different amplitudes or angles, and
a distance between adjacent ones of the plurality of convex portions forming the convexo-concave structure of each of the first electrode and the second electrode is equal to or more than a peak wavelength of light radiated from the emitting layer and is equal to or less than a propagation distance ($L_{sp}$), represented by a numerical formula (1) below, of surface plasmon propagated along the interface between one of the first electrode and the second electrode having the convexo-concave structure and the organic compound layer, $$L_{sp}=1/Im(2k_{sp}) \qquad (1)$$

where: Im represents an imaginary part of a complex number; and $k_{sp}$ represents a wave number of the surface plasmon and is represented by a numerical formula (2) below, in the numerical formula (2), ω represents a frequency of light, c represents a speed of the light, $\in_1$ represents a complex permittivity of the organic compound layer, and $\in_2$ represents a complex permittivity of one of the first electrode and the second electrode having the convexo-concave structure, $$k_{sp} = \frac{\omega}{c} \times \sqrt{\frac{(\varepsilon_1 \times \varepsilon_2)}{(\varepsilon_1 + \varepsilon_2)}}. \tag{2}$$

2. The organic electroluminescence device according to claim 1, wherein the distance between the convex portions is equal to or more than 600 nm and is equal to or less than the propagation distance ($L_{sp}$) of the surface plasmon.

3. The organic electroluminescence device according to claim 1, wherein the distance between the convex portions is equal to or more than a coherence length of the light radiated from the emitting layer and is equal to or less than the propagation distance ($L_{sp}$) of the surface plasmon.

4. The organic electroluminescence device according to claim 1, wherein the distance between the convex portions is equal to or more than four times as large as a peak wavelength of light radiated from the emitting layer and is equal to or less than the propagation distance ($L_{sp}$) of the surface plasmon.

5. The organic electroluminescence device according to claim 1, wherein the first electrode or the second electrode having the convexo-concave structure is made of a metal.

6. The organic electroluminescence device according to claim 1, further comprising:
an optical member comprising a circular polarization layer that converts incident light into circular polarized light, the optical member being provided on an opposite surface of the light-transmissive substrate from a surface of the light-transmissive substrate on which the second electrode is provided.

7. Electronic equipment comprising the organic electroluminescence device according to claim 1.

8. The organic electroluminescence device according to claim 1, wherein an extraction direction of light radiated from the emitting layer is a direction toward the first electrode from the emitting layer, and the second electrode has the convexo-concave structure at the interface with the organic compound layer.

9. The organic electroluminescence device according to claim 8, further comprising:
an optical member comprising a circular polarization layer that converts incident light into circular polarized light, the optical member being positioned to face the first electrode.

10. An organic electroluminescence device comprising:
a first electrode;
a second electrode facing the first electrode;
an organic compound layer provided between the first electrode and the second electrode, the organic compound at least comprising an emitting layer;
a light-transmissive substrate provided to an opposite surface of the second electrode from a surface of the second electrode facing the first electrode; and
an inner-light extraction layer that is provided adjacent to a surface of the light-transmissive facing the second electrode, wherein
the inner-light extraction layer comprises: a first convexo-concave structure comprising a plurality of first convex portions and a plurality of first concave portions, the first convexo-concave structure being provided on an opposite surface of the inner-light extraction layer from a surface of the inner-light extraction layer facing the light-transmissive substrate,
the first electrode also comprises a second convexo-concave structure that is formed matching the first convexo-concave structure and comprises a plurality of second convex portions and a plurality of second concave portions,
the second convexo-concave structure comprises at least one cross section in a thickness direction of the light-transmissive substrate, the cross section being shaped in a sine-wave curve or a curve of a sum of a plurality of sine waves having different amplitudes or angles,
a distance between adjacent ones of the plurality of second convex portions forming the second convexo-concave structure is equal to or more than a peak wavelength of light radiated from the emitting layer and is equal to or less than a propagation distance ($L_{sp}$), represented by a numerical formula (3) below, of surface plasmon propagated along an interface between the first electrode and the organic compound layer, $$L_{sp} = 1/Im(2k_{sp}) \tag{3}$$

where: Im represents an imaginary part of a complex number; and $k_{sp}$ represents a wave number of the surface plasmon and is represented by a numerical formula (4) below,
in the numerical formula (4), $\omega$ represents a frequency of light,
c represents a speed of the light,
$\varepsilon_1$ represents a complex permittivity of the organic compound layer, and
$\varepsilon_2$ represents a complex permittivity of the first electrode, $$k_{sp} = \frac{\omega}{c} \times \sqrt{\frac{(\varepsilon_1 \times \varepsilon_2)}{(\varepsilon_1 + \varepsilon_2)}}. \tag{4}$$

11. The organic electroluminescence device according to claim 10, wherein the distance between the second convex portions is equal to or more than 600 nm and is equal to or less than the propagation distance ($L_{sp}$) of the surface plasmon.

12. The organic electroluminescence device according to claim 10, wherein the distance between the second convex portions is equal to or more than a coherence length of the light radiated from the emitting layer and is equal to or less than the propagation distance ($L_{sp}$) of the surface plasmon.

13. The organic electroluminescence device according to claim 10, wherein the distance between the second convex portions is equal to or more than four times as large as a peak wavelength of light radiated from the emitting layer and is equal to or less than the propagation distance ($L_{sp}$) of the surface plasmon.

14. The organic electroluminescence device according to claim 10, further comprising: a second light extraction layer for emitting the light, which is radiated from the emitting layer and is incident on the light-transmissive substrate, to an outside of the organic electroluminescence device, the second light extraction layer being provided on an opposite surface of the light-transmissive substrate from a surface of the light-transmissive substrate facing the inner-light extraction layer.

15. The organic electroluminescence device according to claim 14, further comprising:
an optical member comprising a circular polarization layer that converts incident light into circular polarized light, the optical member being spaced from the second light extraction layer with a predetermined interval or being adjacent to the second light extraction layer.

16. The organic electroluminescence device according to claim 15, wherein
the optical member comprises a retarder and a polarizer, the retarder is located to face the second light extraction layer, and
the polarizer is adjacent to the retarder and faces an outside of the device.

17. The organic electroluminescence device according to claim 16, wherein the polarizer is a linear polarizer, and the retarder is a quarter-wave plate.

18. The organic electroluminescence device according claim 10, wherein the first electrode is made of a metal.

19. The organic electroluminescence device according to claim 10, further comprising:
an optical member comprising a circular polarization layer that converts incident light into circular polarized light, the optical member being provided on an opposite surface of the light-transmissive substrate from a surface of the light-transmissive substrate on which the second electrode is provided.

20. Electronic equipment comprising the organic electroluminescence device according to claim 10.

* * * * *